(12) United States Patent
Gilliland

(10) Patent No.: US 8,634,195 B2
(45) Date of Patent: Jan. 21, 2014

(54) HEATSINK WITH SUBSTANCE EMBEDDED TO SUPPRESS ELECTROMAGNETIC INTERFERENCE

(75) Inventor: Don A. Gilliland, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 208 days.

(21) Appl. No.: 13/224,155

(22) Filed: Sep. 1, 2011

(65) Prior Publication Data

US 2013/0058045 A1   Mar. 7, 2013

(51) Int. Cl.
*H05K 7/20* (2006.01)

(52) U.S. Cl.
USPC ...... 361/712; 361/679.54; 361/704; 361/709; 361/710; 361/816; 361/818; 165/80.3; 165/104.33; 165/185; 257/712; 257/713; 257/718; 174/16.3; 174/35 R

(58) Field of Classification Search
USPC ............... 361/679.46–679.54, 690–697, 688, 361/689, 704–712, 714–722, 800, 801, 802, 361/816, 818; 165/80.3, 80.4, 80.5, 104.33, 165/185; 257/706–727, 659, 796, 798, 668, 257/698, 690; 174/15.1, 16.3, 252, 35 R, 174/35 GC, 50, 54, 50.52; 428/323, 325, 428/329, 336, 423.1, 412
See application file for complete search history.

(56) References Cited

U.S. PATENT DOCUMENTS

| | | | | |
|---|---|---|---|---|
| 3,246,262 A | * | 4/1966 | Wichert | .......................... 333/1.1 |
| 5,107,070 A | * | 4/1992 | Benn et al. | ..................... 174/354 |
| 5,474,309 A | * | 12/1995 | Balsells | ......................... 277/651 |
| 5,880,930 A | * | 3/1999 | Wheaton | ....................... 361/690 |
| 6,044,899 A | | 4/2000 | Langley et al. | |
| 6,167,949 B1 | | 1/2001 | Langley et al. | |
| 6,577,504 B1 | * | 6/2003 | Lofland et al. | ................. 361/709 |
| 6,944,025 B2 | * | 9/2005 | Hockanson et al. | .......... 361/719 |
| 6,982,481 B1 | * | 1/2006 | Sonderegger et al. | ......... 257/713 |
| 7,204,701 B1 | * | 4/2007 | Balasingham et al. | ......... 439/73 |
| 7,355,857 B2 | * | 4/2008 | Pirillis et al. | .................. 361/715 |
| 7,417,078 B2 | | 8/2008 | Fujiki et al. | |
| 7,529,095 B2 | * | 5/2009 | Whitton | ......................... 361/719 |
| 7,575,956 B2 | * | 8/2009 | Ararao et al. | ................. 438/123 |
| 7,608,326 B2 | | 10/2009 | Johnson | |
| 7,842,381 B2 | | 11/2010 | Johnson | |

(Continued)

FOREIGN PATENT DOCUMENTS

| JP | 2098200 A | 4/1990 |
|---|---|---|
| JP | 3014300 A | 1/1991 |

(Continued)

OTHER PUBLICATIONS

EMI suppression ferrite tiles, http://www.intermark-usa.com/products/EMC/Ferrite/SD_series.shtml, 2005-2006 Intermark (U.S.A.), Inc., San Jose, CA.

*Primary Examiner* — Michail V Datskovskiy
(74) *Attorney, Agent, or Firm* — Toler Law Group

(57) ABSTRACT

A heatsink may include an area in thermal contact with a semiconductor microchip surface and a first trench of a first depth. The first trench may be substantially continuous around the area. A first substance, such as ferrite, may be positioned in the first trench to attenuate electromagnetic interference. A second trench having a second depth may be formed around and further from the area than the first trench. A second substance may be positioned in the second trench.

20 Claims, 3 Drawing Sheets

(56) References Cited

U.S. PATENT DOCUMENTS

| | | | |
|---|---|---|---|
| 8,013,258 B2* | 9/2011 | Wu | 174/382 |
| 8,213,180 B2* | 7/2012 | Zhao et al. | 361/720 |
| 2004/0119552 A1* | 6/2004 | Wray | 333/22 R |
| 2009/0027859 A1* | 1/2009 | Giacoma | 361/709 |
| 2011/0094827 A1* | 4/2011 | Takahashi et al. | 181/294 |

FOREIGN PATENT DOCUMENTS

| | | | | |
|---|---|---|---|---|
| JP | 410173113 A | * | 6/1998 | H01L 23/40 |
| JP | 2001358265 A | | 12/2001 | |
| JP | 2002008923 A | * | 1/2002 | H01F 27/08 |
| JP | 2010118465 A | * | 5/2010 | H01F 37/00 |

* cited by examiner

US 8,634,195 B2

HEATSINK WITH SUBSTANCE EMBEDDED TO SUPPRESS ELECTROMAGNETIC INTERFERENCE

FIELD OF THE DISCLOSURE

The present disclosure relates generally to computing technologies, and more particularly, to managing heat and electromagnetic energy associated with a heatsink and related circuit board components.

BACKGROUND

Electromagnetic interference (EMI) is a disturbance that affects an electrical circuit due to electromagnetic radiation. The disturbance may interrupt or otherwise degrade the performance of the circuit. Undesirable electromagnetic radiation often originates in integrated circuits (ICs) and is radiated by other structures at a level sufficient to cause interference with other components. A heatsink can be particularly problematic.

Heatsinks are used to redirect heat away from microchip surfaces. In the course of operation, energy from the microchip may capacitively couple to a heatsink. The energy may exit the heatsink as radiated EMI. Due to its large, metallic surface area, a heatsink may serve as an antenna for propagating electromagnetic radiation. A conventional attempt to reduce EMI includes extending drop points from a heatsink to logic ground to de-tune or shift the frequency of the electromagnetic radiation. While this technique may achieve EMI compliance, the drop points occupy scarce circuit board space that could be used for other circuit board functionality.

SUMMARY

A particular embodiment may include a heatsink comprising an area in thermal contact with a semiconductor microchip surface and a first trench of a first depth. The first trench may be continuous around the area. A first substance may be positioned in the first trench to attenuate electromagnetic interference. Another or the same embodiment may include a second trench of a second depth that is continuous around and further from the area than the first trench. A second substance may be positioned in the second trench.

According to another particular embodiment, an apparatus includes a heatsink body having a first recessed surface and a central core section extending in a direction away from the first recessed surface. The apparatus may further include at least one surface adjacent to an aperture partially bounded by the first recessed surface and a first substance positioned in the aperture to attenuate electromagnetic interference.

A particular embodiment of a method may include positioning an area of a heatsink in thermal contact with a semiconductor microchip surface and forming a first trench of a first depth in the heatsink. The first trench may be continuous around the area. A first substance may be positioned in the first trench to attenuate electromagnetic interference.

These and other advantages and features that characterize embodiments of the disclosure are set forth in the claims listed below. However, for a better understanding of the disclosure, and of the advantages and objectives attained through its use, reference should be made to the drawings and to the accompanying descriptive matter in which there are described exemplary embodiments of the disclosure.

DETAILED DESCRIPTION

An embodiment may reduce electromagnetic interference by embedding a substance, such as ferrite, into a heatsink. Placement and dimensions of the substance may affect the frequency characteristics of the heatsink. For example, incorporation of the substance may detune the heatsink by altering the flow of current and affecting a resonance point associated with the EMI. An embodiment may tradeoff thermal capability against EMI frequency suppression. For instance, just enough substance may be embedded in a heatsink as is useful to capture or otherwise suppress a problematic frequency. As the current flows through the heatsink, the magnetic flux associated with the current may travel through the ferrite substance. The substance may raise impedance and lower current within the heatsink. Electromagnetic energy may be converted into suppressed high frequency heat energy as the heatsink transfers low frequency heat energy away from the surface of the microchip. As a result, EMI emissions from the heatsink may be reduced.

Figure 1:
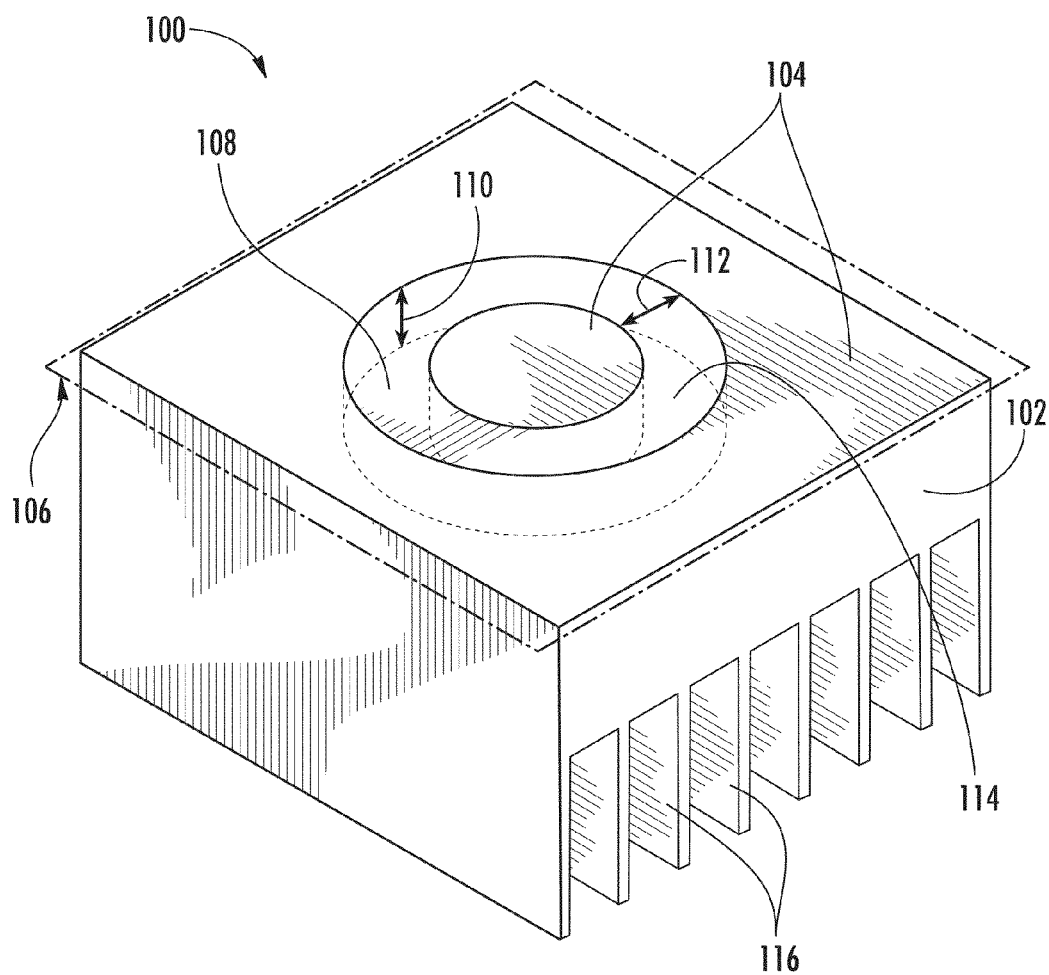
FIG. 1 shows an embodiment of an apparatus comprising a heatsink having a concentric, entrenched substance configured to attenuate electromagnetic interference.

FIG. 1 shows an embodiment of an apparatus 100 comprising a heatsink 102 having a concentric, entrenched substance 114. The heatsink 102 may include an area 104 in thermal contact with a semiconductor microchip surface 106. For example, the area 104 may be positioned near or directly adjacent the semiconductor microchip surface 106. The heatsink 102 may include a trench 108, or recessed surface, having a depth 110 and a width 112. The trench 108 may be continuous or substantially continuous around the area 104. At least one of the depth 110 and the width 112 may be determined based on a frequency or amplitude of the EMI to be suppressed.

The cross-sectional area of the trench 108 may be constant or may vary at different points along the trench 108. For example, the depth 110 of the trench may be larger at one portion of the trench 108 than at another portion to affect desired frequency suppression. According to a particular embodiment, a larger cross-sectional area of the substance 114 may suppress more amplitude and may adjust the frequency response to capture a lower frequency.

The substance 114 may be positioned in the trench 108 to attenuate electromagnetic emissions (e.g., interfering with the semiconductor microchip surface 106 or other surrounding circuitry). The substance 114 of an embodiment may include ferrite or a ferrite alloy. The depth 110 and the width 112 accommodating the substance 114 may be formed to suppress or otherwise affect one or more frequencies associated with the EMI. The substance 114 may be recessed from the surface of the area 104. In an alternative embodiment, the substance 114 may be flush with the surface of the area 104. At least one of the area 104 and the substance 114 may be formed in the shape of or to otherwise cover a surface of a module of the microchip surface 106.

The material of which the heatsink 102 is comprised may include aluminum, copper, an aluminum or copper alloy, or diamond, among other heat dispersing materials. Fins 116 may extend in a direction away from the semiconductor microchip surface 106 to disperse heat.

Though not shown, the embodiment of FIG. 1 may include a metal layer (e.g., aluminum or copper) positioned between the area 104 and the microchip surface 106 for additional frequency suppression. The layer may be sized to cover a shape of a module on the microchip surface 106 and may cooperate with the substance 114 to direct current flow and suppress undesirable frequencies.

Figure 2:
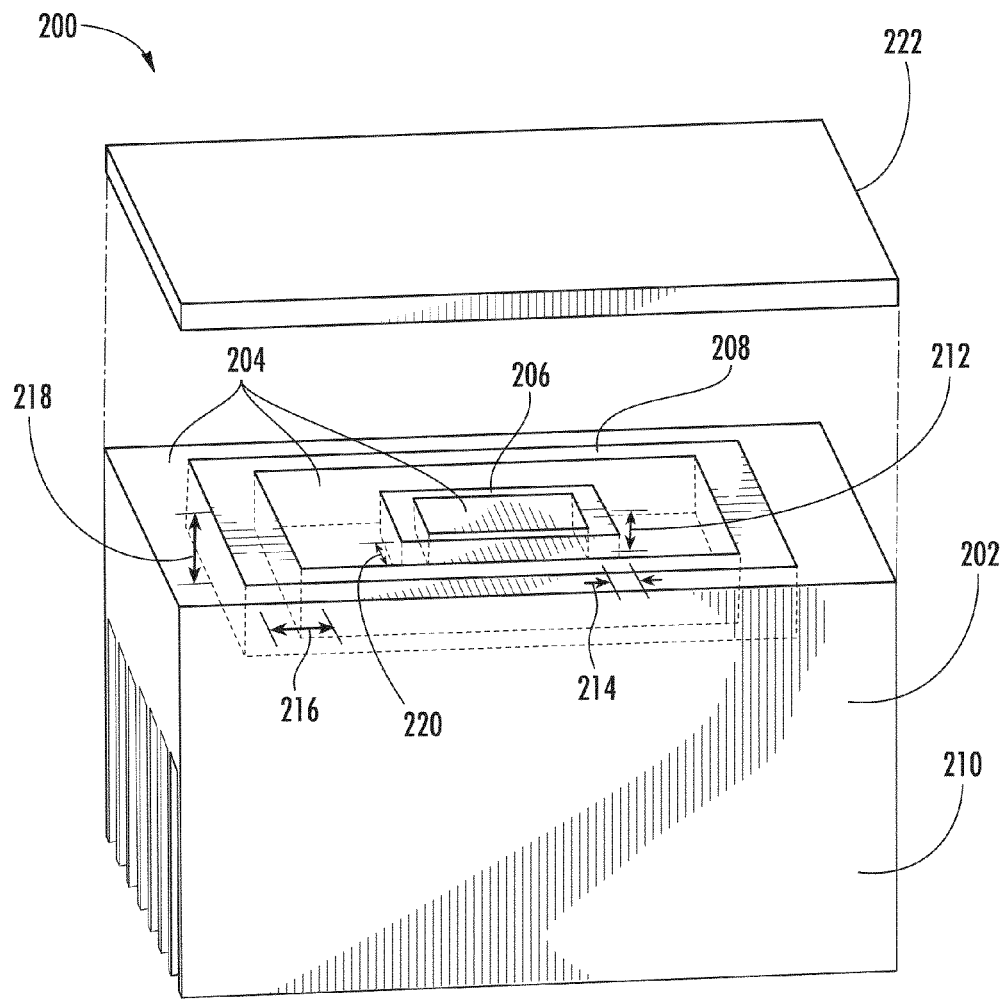
FIG. 2 shows an embodiment of an apparatus having multiple, concentric substances entrenched into a heatsink to attenuate electromagnetic interference.

FIG. 2 shows an embodiment of an apparatus 200 having multiple, concentric substances 206, 208 entrenched into a heatsink 202. In the illustrated embodiment, the heatsink 202 includes at least one rectangular area 204. At least one of the first and second substances 206, 208 may be recessed from the first surface 204. In another or the same embodiment, at least one of the first and second substances 206, 208 may be flush with the first surface 204.

The size and shape of the substances 206, 208 may be determined according to an EMI frequency or amplitude to be suppressed. For example, a cross-sectional area of the first substance 206 may be made larger to suppress relatively more amplitude and to adjust the frequency response to capture a lower frequency. The first substance 206 may have a cross-sectional area that includes a first depth 212 and a first width 214. The second substance 208 may have a cross-sectional area that includes a second width 216 and a second depth 218. The first substance 206 and the second substance 208 may be separated by a distance 220. The lengths of the first depth 212, first width 214, the second width 216, and second depth 218 may be collectively or individually set to affect different frequencies. The dimensions of the respective cross-sectional areas may further be set with respect to one another. Furthermore, the distance 220 between the first substance 206 and the second substance 208 may be set to suppress a particular frequency. For example, the length of the first depth 212 may be determined in relation to one or more of: the first width 214, the second width 216, the second depth 218, and the distance 220.

In a particular embodiment, the cross-sectional areas of the first and second substances 206, 208 are not the same. For example, the first substance 206 may have a smaller cross-sectional area in order to affect relatively higher frequencies and to influence associated current close to a module on the microchip surface. The outer, second substance 208 may have a larger cross-sectional area in order to capture lower frequencies that are not suppressed by the first substance 206. The cross-sectional area of the second substance 208 may further affect an amplitude of the current in the heatsink that is unaffected by the first substance 206.

The first and the second substances 206, 208 may include ferrite. The compositions of the first and the second substances 206, 208 may be the same or different. For example, the first substance 206 may include greater ferrite content than an alloy of the second substance 208. The respective compositions of the first and the second substances 206, 208 may be set to suppress a target frequency. The compositions of the first and the second substances 206, 208 may be based on the other's respective composition, and may further be based on one or more of the length of: the first depth 212, the first width 214, the second width 216, the second depth 218, and the distance 220.

The shape of the first substance 206 and the second substance 208 may be set to suppress a particular frequency. For example, a particular dimension (e.g., the first depth 212) may have a different cross-sectional area than another particular cross-sectional area (e.g., the first width 214). Any of the respective dimensions (e.g., the length of the first depth 212, the first width 214, the second width 216, the second depth 218, and the distance 220) may be set as a ratio of one another to suppress a target frequency.

An embodiment may include a layer 222 positioned between the first surface 204 and the microchip surface for additional frequency suppression. The layer 222 may be metallic, such as aluminum or copper, and may cooperate with the substances 206, 208 to suppress undesirable frequencies. The layer 222 may be sized to cover a shape of a module on the microchip surface.

Figure 3:
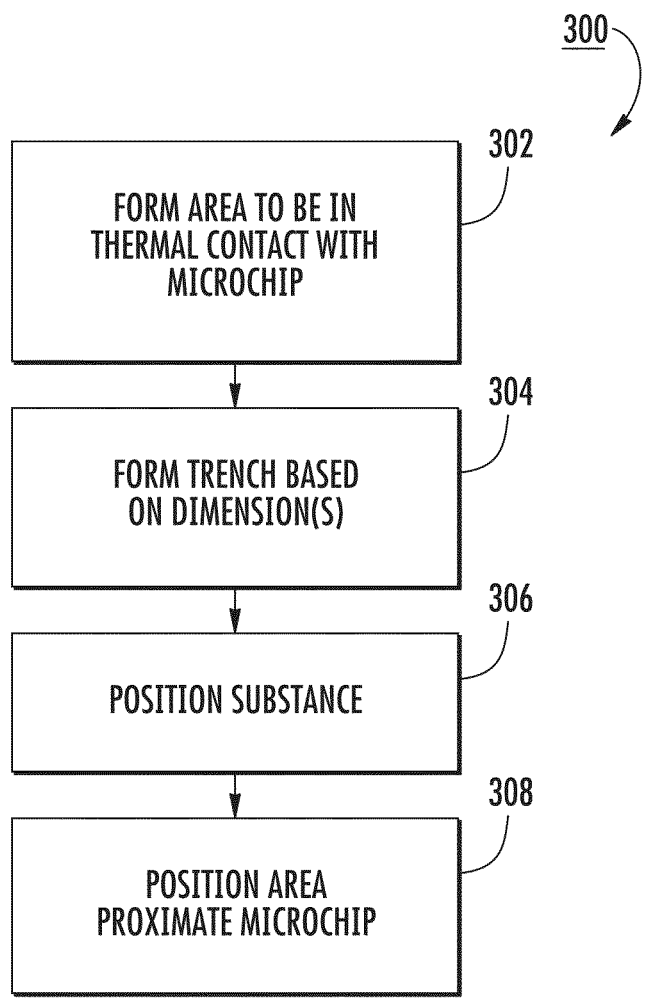
FIG. 3 shows an embodiment of a method of manipulating a heatsink to affect electromagnetic interference.

FIG. 3 shows an embodiment of a method of controlling electromagnetic emissions at a heatsink. At 302, an area of a heatsink may be formed for placement in thermal contact with a microchip surface. The heatsink area may be formed from metals (e.g., copper or aluminum) with heat conductive properties to transfer heat away from the surface of the microchip.

One or more trenches may be milled, etched, or otherwise formed into the heatsink at 304 to accommodate a substance. The substance may be ferrite or a ferrite alloy. The trenches may be thus formed according to one or more dimensions of the substance to be placed in the heatsink, as well as of the heatsink, itself. For example, a relatively larger cross-sectional area of the substance may be used to suppress more amplitude and may adjust the frequency response to capture a lower frequency. The sizes and spacing of a trench may further be determined based on the size and position of another trench.

The substance may be placed in the trench at 306. For instance, the substances 206 and 208 may be pressed into the trench of the heatsink 202. Alternatively, a pressure sensitive adhesive on the substances 206 and 208 may be used to adhere the substances 206 and 208 to the heatsink.

At 308, the area of the heatsink may be positioned proximate the microchip surface. Current may attempt to couple back toward the surface of the microchip through direct capacitance or displacement capacitance. As the current flows through the heatsink, it may travel through the substance. The substance may raise impedance and lower current within the heatsink. Electromagnetic energy may be converted into suppressed high frequency heat energy, as the heatsink transfers low frequency heat energy away from the surface of the microchip. As a result, EMI emissions from the heatsink may be reduced.

In a particular embodiment, the disclosed methods are implemented partly in software that is embedded in processor readable storage medium and executed by a processor, which includes but is not limited to firmware, resident software, microcode, etc. Particular embodiments may thus include a computing device comprising a processor configured to execute program code to design a heatsink, as described herein. For example, program code may be executed to automatically determine dimensions of the heatsink and the substance, as well as the placement of the substance with relation to desired EMI suppression and achieve EMI compliance.

Further, embodiments of the present disclosure may take the form of a computer program product accessible from a computer-usable or computer-readable storage medium providing program code for use by or in connection with a computer or any instruction execution system. For the purposes of this description, a computer-usable or computer-readable storage medium may be any apparatus that may tangibly embody a computer program and that may contain, store, communicate, propagate, or transport the program for use by or in connection with the instruction execution system, apparatus, or device.

In various embodiments, the medium may include an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. An example of a computer-readable storage medium may be non-transitory in nature. Current examples of optical disks include compact disk-read only memory (CD-ROM), compact disk-read/write (CD-R/W) and digital versatile disk (DVD).

A data processing system suitable for storing and/or executing program code may include at least one processor coupled directly or indirectly to memory elements through a system bus. The memory elements may include local memory employed during actual execution of the program code, bulk storage, and cache memories which provide temporary storage of at least some program code in order to reduce the number of times code must be retrieved from bulk storage during execution. Input/output or I/O devices (including but not limited to keyboards, displays, pointing devices, etc.) may be coupled to the data processing system either directly or through intervening I/O controllers. Network adapters may also be coupled to the data processing system to enable the data processing system to become coupled to other data processing systems or remote printers or storage devices through intervening private or public networks. Modems, cable modems, and Ethernet cards are just a few of the currently available types of network adapters.

In operation, a round or square shaped ferrite material may be embedded into a heatsink around a central core section. Heat may flow upward from the central core section to the remainder of the heatsink. Energy may be reflected by the core (e.g., in a manner analogous to an active dipole antenna). The ferrite may provide high impedance to current flowing through the central core section to the bulk of the heatsink. The shape, length, ratio of the outside diameter to the inside diameter, and cross sectional area of the ferrite section(s) and the central core section may be set with regard to one another to affect the response of the heatsink for coupling. Grounding may be added to the outside edges or edges (e.g., near the outside the perimeter) of the central core section to increase the effectiveness of the central core section by making the combination a series inductor with a shunt to ground or two section inductor-capacitor filter.

The central core section may transfer heat, and the heatsink height may be increased during a design phase to compensate for spreading inefficiency in the base. The central core section may be large enough to allow the heat to be transferred based on microchip size to the remainder of the heatsink. A tradeoff of an embodiment may include heatsink performance verses heatsink electromagnetic interference. As such, a design process may include selecting a dimension(s) of one or more of the core section and the embedded substance as a function of both thermal communication and electromagnetic emission. A method of an embodiment may allow a failing design to obtain compliance.

The embedded substance may have a circular or rectangular surface. The module may only contact the heatsink on a metallic surface, rather than to overlap or touch ferrite material. This feature may preserve the heat transfer or spreading capability on the heatsink module interface. Concentric ferrite embedded into the heatsink may be suppressed by the outer rectangular ring of ferrite as well as the inner ring. The two rings may have the same or different cross-sectional areas. For example, an outer trench may have a larger or smaller cross-sectional area than an inner trench. Ferrite may or may not touch the microchip surface. A thin aluminum plate may be positioned between the heatsink and the microchip surface. The plate may be sized to cover the surface of a module on the microchip surface.

The previous description of the disclosed embodiments is provided to enable a person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and features as defined by the following claims.

What is claimed is:

1. A heatsink comprising:
    an area configured to be placed in thermal contact with a semiconductor microchip surface;
    a first trench of a first depth in the heatsink, the first trench being substantially continuous around the area; and
    a first substance positioned in the first trench to attenuate electromagnetic interference, wherein the first substance is recessed from or flush with the area.

2. The heatsink of claim 1, further comprising:
    a second trench of a second depth being substantially continuous around the area and further from the area than the first trench; and
    a second substance positioned in the second trench to attenuate the electromagnetic interference.

3. The heatsink of claim 2, wherein at least one of the first and second substances includes ferrite.

4. The heatsink of claim 1, further comprising a layer of heat dispersing material located between the first substance and the semiconductor microchip surface.

5. The heatsink of claim 2, wherein the first depth is different than the second depth.

6. The heatsink of claim 2, wherein the first trench has a first width, and the second trench has a second width, wherein the first width is different than the second width.

7. The heatsink of claim 2, wherein the first trench has a first width, and the second trench has a second width, wherein the first width is the same as the second width.

8. The heatsink of claim 1, wherein a shape of the area is circular or rectangular.

9. An apparatus comprising:
    a heatsink body comprising a first recessed surface, wherein the first recessed surface forms an aperture;
    a central core section protruding from the aperture formed by the first recessed surface; and
    a first substance positioned in the aperture, wherein the first substance is configured to attenuate electromagnetic interference.

10. The apparatus of claim 9, wherein the heatsink body further comprises a second recessed surface continuous around the first recessed surface.

11. A method comprising:
    forming a first trench of a first depth in a heatsink, the first trench being substantially continuous around an area of the heatsink, the area configured to be in thermal contact with a semiconductor microchip surface; and
    positioning a first substance in the first trench to attenuate electromagnetic interference, wherein the first substance is recessed from or flush with the area.

12. The method of claim 11, wherein a dimension of the area is determined based on another dimension of of the area.

13. The method of claim 11, further comprising:
    forming a second trench of a second depth, the second trench being substantially continuous around the area and further from the area than the first trench; and
    positioning a second substance in the second trench to attenuate the electromagnetic interference.

14. The method of claim 13, wherein a dimension of the first substance is determined based on a dimension of the second substance.

15. The method of claim 13, wherein a first dimension of the first substance is associated with a first attenuation of a first frequency associated with the electromagnetic interference, and wherein a second dimension of the second substance is associated with a second attenuation of a second frequency associated with the electromagnetic interference.

16. The heatsink of claim 1, wherein the first trench is continuous around the area.

17. The heatsink of claim 5, wherein the first depth is smaller than the second depth.

18. The heatsink of claim 6, wherein the first width is smaller than the second width.

19. The heatsink of claim 9, wherein the heatsink comprises copper or aluminum.

20. The apparatus of claim 9, wherein an area of the central core is configured to be placed in contact with a surface of a semiconductor microchip surface.

\* \* \* \* \*